(12) United States Patent
Prakash et al.

(10) Patent No.: US 8,154,700 B2
(45) Date of Patent: Apr. 10, 2012

(54) ELECTRONIC DEVICE HAVING ELECTRODES AND ORGANIC ACTIVE REGIONS AND PROCESSES OF FORMING THE SAME

(75) Inventors: Shiva Prakash, Santa Barbara, CA (US); Marie B. O'Regan, Santa Barbara, CA (US); William F. Feehery, Santa Barbara, CA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 12/344,309

(22) Filed: Dec. 26, 2008

(65) Prior Publication Data

US 2010/0237347 A1    Sep. 23, 2010

Related U.S. Application Data

(60) Provisional application No. 61/017,229, filed on Dec. 28, 2007.

(51) Int. Cl.
*G02F 1/1343*    (2006.01)

(52) U.S. Cl. .............. 349/144; 349/69; 257/59; 438/34

(58) Field of Classification Search .................... 349/69, 349/144, 106; 438/34; 257/40, E51.027, 257/59

See application file for complete search history.

(56) References Cited

U.S. PATENT DOCUMENTS 6,518,709 B2* 2/2003 Iketsu et al. ............... 315/169.3
6,863,961 B2* 3/2005 Miyashita et al. ............ 428/203

* cited by examiner

*Primary Examiner* — Thoi Duong (57) ABSTRACT

An electronic device can include an electrode and an organic active region. In one aspect, the electronic device can include the electrode having a corresponding pitch and an organic active region adjacent to the electrode, wherein the organic active region has a width greater than the corresponding pitch. In another aspect, an electronic device can include a first set of electrodes oriented substantially along a direction and a second set of electrodes oriented substantially along the direction. The electronic device can also include a space between the first and second sets of the electrodes. The electronic device can still further include an organic active region overlying or underlying the first and second sets of electrodes and the space. In other aspects, processes of forming the electronic devices are also disclosed.

19 Claims, 6 Drawing Sheets

ELECTRONIC DEVICE HAVING ELECTRODES AND ORGANIC ACTIVE REGIONS AND PROCESSES OF FORMING THE SAME

CROSS REFERENCE TO RELATED APPLICATION

This application claims the benefit of priority under 35 U.S.C. §119(e) from provisional U.S. Application No. 61/017,229, filed Dec. 28, 2007, which is incorporated herein by reference in its entirety.

FIELD OF THE DISCLOSURE

This disclosure relates in general to electronic devices and processes, and more particularly, to electronic devices having electrodes and organic active regions and processes of forming the same.

DESCRIPTION OF THE RELATED ART

An electronic device can include a liquid crystal display ("LCD"), an organic light-emitting diode (OLED) display, or the like. The manufacture of electronic devices may be performed using solution deposition techniques. One process of making electronic devices is to deposit organic layers over a substrate by printing (e.g., ink-jet printing, continuous printing, etc.). In a printing process, the liquid composition being printed includes an organic material in a solution, dispersion, emulsion, or suspension with an organic solvent, with an aqueous solvent, or with a combination of solvents. After printing, the solvent(s) is(are) evaporated and the organic material remains to form an organic layer for the electronic device.

When forming high-resolution patterns, e.g., 200 or more dots per inch ("dpi"), relatively small droplets or relatively narrow lines are printed. Typically, for an electronic device with 100 to 130 dpi when using ink-jet printing, the droplet volume ranges between a few tenths of a picoliter to a few picoliters. When the volume of the droplet is in this range, fluctuations of the volume between droplets become significant.

SUMMARY

An electronic device can include an electrode and an organic active region. In one aspect, the electronic device can include the electrode having a corresponding pitch and an organic active region adjacent to the electrode, wherein the organic active region has a width greater than the corresponding pitch. In another aspect, an electronic device can include a first set of electrodes oriented substantially along a direction and a second set of electrodes oriented substantially along the direction. The electronic device can also include a space between the first and second sets of the electrodes. The electronic device can still further include an organic active region overlying or underlying the first and second sets of electrodes and the space.

In a further aspect, a process of forming an electronic device can include providing a substrate and forming a first set and a second set of first electrodes over the substrate, wherein each of the first and second sets of the first electrodes are oriented substantially along a direction, and the first set of the first electrodes are spaced apart from the second set of the first electrodes by a first space. The process can also include forming a third set and a fourth set of second electrodes over the substrate, wherein each of the third and fourth sets of the second electrodes are oriented substantially along the direction, and the third set of the second electrodes are spaced apart from the fourth set of the second electrodes by a second space. The process can further include forming a fifth set of third electrodes over the substrate and between the first set of the first electrodes and the third set of the second electrodes. The process can still further include forming a first organic active region over the substrate, forming a second organic active region over the substrate, and forming a third organic active region over the substrate. The first organic active region can overlie or underlie the first and second sets of the first electrodes and the first space, the second organic active region can overlie or underlie the third and fourth sets of the second electrodes and the second space, and the third organic active layer can lie between the first organic active region and the second organic active region and overlie or underlie the fifth set of third electrodes.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device can include electrodes, spaces between electrodes, and at least one organic active region. In a first aspect, the electronic device can include a first electrode of a first sub-pixel of a first pixel, wherein the first electrode has a corresponding pitch, and a first organic active region adjacent to the first electrode, wherein the first organic active region has a width greater than the corresponding pitch.

In an embodiment of the first aspect, the first organic active region is characterized by a corresponding resolution limit, and the corresponding resolution limit is at least 2 times a width of the first electrode. In a particular embodiment, the electronic device further includes a first electrode of a first sub-pixel of a second pixel, wherein lengths of the first electrode of the first sub-pixel of the first pixel and the first electrode of the first sub-pixel of the second pixel are substantially parallel to each other, and a sum of (i) the widths of the first electrodes and (ii) a width of a space between the first electrodes is less than 2 times the corresponding resolution limit.

In another embodiment of the first aspect, the electronic device further includes a first electrode of a first sub-pixel of a second pixel, wherein from a top view, a first space lies between the first electrodes, and the first organic active region lies adjacent to the first electrodes and the first space. The electronic device can also include a second electrode of a second sub-pixel of the first pixel, and a second electrode of a second sub-pixel of a third pixel, wherein from a top view, a second space lies between the second electrodes. The electronic device can further include a second organic active region lying adjacent to the second electrodes and the second space.

In a particular embodiment of the first aspect, the electronic device further includes a substrate, wherein the first electrodes and the first space lie between the substrate and the first organic active region, and the second electrodes and the second space lie between the substrate and the second organic active region. In another particular embodiment, the electronic device further includes a third electrode of a third sub-pixel of the first pixel, wherein the third electrode lies between the first electrode of the first sub-pixel of the first pixel and the second electrode of the second sub-pixel of the first pixel, a third electrode of a third sub-pixel of the second pixel, wherein the third sub-pixel of the second pixel lies adjacent to the first sub-pixel of the second pixel, and a third electrode of a third sub-pixel of the third pixel, wherein the third sub-pixel of the third pixel lies adjacent to the second sub-pixel of the third pixel. The electronic device can further include a third organic active layer lying adjacent to the third electrodes.

In a more particular embodiment of the first aspect, the first organic active region overlies the first electrodes but not the second electrodes or the third electrodes, the second organic active region overlies the second electrodes but not the first electrodes or the third electrodes, and a third organic active layer overlies the third electrodes. In another more particular embodiment, each first sub-pixel of a particular pixel lies between a third sub-pixel of the particular pixel and a different first sub-pixel of a different pixel, each second sub-pixel of the particular pixel lies between the third sub-pixel of the particular pixel and a second sub-pixel of another different pixel, and each third sub-pixel lies between a first sub-pixel and a second sub-pixel of a same pixel. In still another more particular embodiment, each of the first sub-pixels includes a red light-emitting component, each of the second sub-pixels includes a green light-emitting component, and each of the third sub-pixels includes a blue light-emitting component. In an even more particular embodiment, along an axis, the electronic device has a repeating emission pattern of RRBGGB, wherein R corresponds to a red light-emitting component, B corresponds to a blue light-emitting component, and G corresponds to a green light-emitting component.

In a second aspect, an electronic device can include a first set of first electrodes oriented substantially along a direction, a second set of first electrodes oriented substantially along the direction, and a first space between the first and second sets of the first electrodes. The electronic device can also include a first organic active region, wherein the first organic active region overlies or underlies the first and second sets of first electrodes and the first space.

In one embodiment of the second aspect, the first organic active region is characterized by a corresponding resolution limit, and a width of the first organic active region is less than 2 times the corresponding resolution limit. In another embodiment, the electronic device further includes a third set of second electrodes oriented substantially along the direction, a fourth set of second electrodes oriented substantially along the direction, a second space between the third and fourth sets of the second electrodes, and a second organic active region, wherein the second organic active region overlies or underlies the second electrodes and the second space. In a particular embodiment, the first electrodes, the first space, and the first organic active region are spaced apart from the second electrodes, the second space, and the second organic active region. In a more particular embodiment, the electronic device further includes a material containment structure, wherein substantially none of the material containment structure overlies the first space or the second space. In another particular embodiment, the electronic device further includes a fifth set of third electrodes oriented substantially along the direction and lying between the first set of first electrodes and the third set of second electrodes, and a third organic active layer lying above or below the third electrodes.

In a third aspect, a process of forming an electronic device can include providing a substrate and forming a first set and a second set of first electrodes over the substrate, wherein each of the first and second sets of the first electrodes are oriented substantially along a direction, and the first set of the first electrodes are spaced apart from the second set of the first electrodes by a first space. The process can also include forming a third set and a fourth set of second electrodes over the substrate, wherein each of the third and fourth sets of the second electrodes are oriented substantially along the direction, and the third set of the second electrodes are spaced apart from the fourth set of the second electrodes by a second space. The process can further include forming a fifth set of third electrodes over the substrate and between the first set of the first electrodes and the third set of the second electrodes. The process can still further include forming a first organic active region over the substrate, wherein the first organic active region overlies or underlies the first and second sets of the first electrodes and the first space, forming a second organic active region over the substrate, wherein the second organic active region overlies or underlies the third and fourth sets of the second electrodes and the second space, and forming a third organic active layer over the substrate, wherein the third organic active layer lies between the first organic active region and the second organic active region and overlies the fifth set of third electrodes.

In an embodiment of the third aspect, forming the first and second sets of the first electrodes, forming the third and fourth sets of the second electrodes, and forming the fifth set of the third electrodes are performed substantially simultaneously. In a particular embodiment, forming the third organic active layer is performed before forming the first organic active region and forming the second organic active region. In another embodiment, forming the first organic active region is performed using equipment, wherein a width of the first organic active region is no more than 1.5 times a resolution limit of the equipment. In still another embodiment, forming the first organic active region is performed such that a width of the first organic active region is no greater than 150 microns.

In a further embodiment of the third aspect, each of forming the first organic active region and forming the second organic active region is performed using a liquid deposition technique. In a particular embodiment, the process further includes forming a material containment structure before forming the first organic active region and forming the second organic active region. In another particular embodiment, forming the third organic active layer includes forming the third organic active layer using a vapor deposition technique after forming the first organic active region and forming the second organic active region.

In still a further embodiment of the third aspect, forming the first organic active region includes forming the first organic active region as a first continuous strip over the first electrodes and the first space, and forming the second organic active region includes forming the second organic active region as a second continuous strip over the second electrodes and the second space. In a particular embodiment, forming the third organic active layer includes forming the third organic active layer over substantially all of a pixel array. In yet another embodiment, the process further includes forming a common electrode over the substrate, wherein the electronic device includes a pixel array including the common electrode, the first electrodes, the first organic active region, the second electrodes, the second organic active region, the third electrodes, and the third organic active layer.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by Resolution and Pitch, Fabrication of an Electronic Device, Alternative Embodiments, Operating the Electronic Device, and finally Benefits.

1. DEFINITIONS AND CLARIFICATION OF TERMS

Before addressing details of embodiments described below, some terms are defined or clarified. The terms "array," "peripheral circuitry," and "remote circuitry" are intended to mean different areas or components of an electronic device. For example, an array may include pixels, cells, or other structures within an orderly arrangement (usually designated by columns and rows). The pixels, cells, or other structures within the array may be controlled by peripheral circuitry, which may lie on the same substrate as the array but outside the array itself. Remote circuitry typically lies away from the peripheral circuitry and can send signals to or receive signals from the array (typically via the peripheral circuitry). The remote circuitry may also perform functions unrelated to the array. The remote circuitry may or may not reside on the substrate having the array.

The term "blue light-emitting component" is intended to mean an electronic component capable of emitting radiation having an emission maximum at a wavelength in a range of approximately 400 to 500 nm.

The term "continuous" and its variants are intended to mean substantially unbroken. In one embodiment, continuously printing is printing using a substantially unbroken stream of a liquid or a liquid composition, as opposed to a depositing technique using drops. In another embodiment, extending continuously refers to a length of a layer, member, or structure in which no significant breaks in the layer, member, or structure lie along its length.

The term "electronic component" is intended to mean a lowest level unit of a circuit that performs an electrical or electro-radiative (e.g., electro-optic) function. An electronic component may include a transistor, a diode, a resistor, a capacitor, an inductor, a semiconductor laser, an optical switch, or the like. An electronic component does not include parasitic resistance (e.g., resistance of a wire) or parasitic capacitance (e.g., capacitive coupling between two conductors electrically connected to different electronic components where a capacitor between the conductors is unintended or incidental).

The term "electronic device" is intended to mean a collection of circuits, electronic components, or any combination thereof that collectively, when properly electrically connected and supplied with the appropriate potential(s), performs a function. An electronic device may be included or be part of a system. An example of an electronic device includes a display, a sensor array, a computer system, an avionics system, an automobile, a cellular phone, other consumer or industrial electronic product, or any combination thereof.

The term "fullerene" refers to a cage-like, hollow molecule composed of hexagonal and pentagonal groups of carbon atoms. In some embodiments, there are at least 60 carbon atoms present in the molecule. The shape can be generally spherical (also referred to as a "bucky ball") or generally cylindrical and have one or more walls (also referred to as a "bucky tube" or "carbon nanotube"). A bucky tube or carbon nanotube may be open ended or may have a generally hemispherical shape on one or both ends.

The term "green light-emitting component" is intended to mean an electronic component capable of emitting radiation having an emission maximum at a wavelength in a range of approximately 500 to 600 nm.

The term "guest material" is intended to mean a material, within a layer including a host material, that changes the electronic characteristic(s) or the targeted wavelength of radiation emission, reception, or filtering of the layer compared to the electronic characteristic(s) or the wavelength of radiation emission, reception, or filtering of the layer in the absence of such material.

The term "host material" is intended to mean a material, usually in the form of a layer, to which a guest material may or may not be added. The host material may or may not have electronic characteristic(s) or the ability to emit, receive, or filter radiation.

The term "liquid composition" is intended to mean a material that is dissolved in a liquid medium to form a solution, dispersed in a liquid medium to form a dispersion, or suspended in a liquid medium to form a suspension or an emulsion.

The term "liquid medium" is intended to a liquid within a solution, dispersion, suspension, or emulsion. The term "liquid medium" is used regardless whether one or more solvents are present, and therefore, liquid medium is used as the singular or plural form (i.e., liquid media) of the term.

The term "material containment structure" is intended to mean a structure within or on a workpiece, wherein such one or more structures, by itself or collectively, serve a principal function of constraining or guiding a material within an area or region as it flows over the workpiece. A material containment structure can include cathode separators or a well structure.

The term "oriented" is intended to mean a principal direction in which a feature extends. As between different features at the same elevation or at different elevations, the features may be oriented substantially parallel, substantially perpendicular, or in another angular relationship with respect to each other.

The term "organic active layer" is intended to mean one or more organic layers, wherein at least one of the organic layers, by itself, or when in contact with a dissimilar material is capable of forming a rectifying junction. The term "organic active region" is intended to mean one or more organic region, wherein at least one of the organic regions, by itself, or when in contact with a dissimilar material is capable of forming a rectifying junction.

The term "organic layer" is intended to mean one or more layers, wherein at least one of the layers comprises a material including carbon and at least one other element, such as hydrogen, oxygen, nitrogen, fluorine, etc.

The term "pitch" is intended to mean a sum of a feature dimension and a space dimension between immediately adjacent features.

The term "pixel" is intended to mean the smallest complete, repeating unit of an array. The term "subpixel" is intended to mean a portion of a pixel that makes up only a part, but not all, of a pixel. In a full-color display, a full-color pixel can comprise three sub-pixels with primary colors in red, green and blue spectral regions. A monochromatic display may include pixels but no subpixels. A sensor array can include pixels that may or may not include subpixels.

The term "printing" is intended to mean an act of selectively depositing a layer by using a printing head or other similar structure to dispense a liquid or liquid composition onto a workpiece.

The term "printing apparatus" is intended to mean a combination of one or more materials, equipment, assembly or subassembly designed for printing a layer onto a workpiece.

The term "radiation-emitting component" is intended to mean an electronic component, which when properly biased, emits radiation at a targeted wavelength or spectrum of wavelengths. The radiation may be within the visible-light spectrum or outside the visible-light spectrum (UV or IR). A light-emitting component, such as a light-emitting diode, is an example of a radiation-emitting component.

The term "radiation-responsive component" is intended to mean an electronic component, which when properly biased, can respond to radiation at a targeted wavelength or spectrum of wavelengths. The radiation may be within the visible-light spectrum or outside the visible-light spectrum (UV or IR). An IR sensor and a photovoltaic cell are examples of radiation-sensing components.

The term "rectifying junction" is intended to mean a junction within a semiconductor layer or within a semiconductor region or a junction formed by an interface between a semiconductor layer or a semiconductor region and a dissimilar material, in which charge carriers of one type flow easier in one direction through the junction compared to the opposite direction. A pn junction is an example of a rectifying junction that can be used as a diode.

The term "red light-emitting component" is intended to mean an electronic component capable of emitting radiation having an emission maximum at a wavelength in a range of approximately 600 to 700 nm.

The term "resolution limit" is intended to mean the smallest feature size that can be reproducibly formed when using a particular apparatus or other equipment.

The term "visible light spectrum" is intended to mean a radiation spectrum having wavelengths corresponding to approximately 400 to 700 nm.

The term "width" is intended to mean a dimension, as seen from a top view and regardless of layer, which is measured in a direction that corresponds to a narrower dimension of a particular feature. The term "length" is intended to mean a dimension, as seen from a top view and regardless of layer, which is measured in a direction substantially perpendicular to the width.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, $81^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. RESOLUTION AND PITCH

Before addressing particular embodiments, resolution and pitch are addressed to aid in understanding the concepts as described herein. As used in this specification, resolution refers to a measure of how finely objects are formed, and typically is expressed as a density (e.g., lines per linear distance or area) or as a dimension of a feature. The resolution limit, which is the smallest feature size that can be reproducibly formed, is typically determined by an apparatus or other equipment, and potentially the processing technique, used to form features. Therefore, different equipment or processes can have different resolution limits.

Lithographic equipment (e.g., projection printers) used in the semiconductor industry can have a resolution limit as low as 20 nm or potentially even smaller. For example, a projection aligner can be used in reproducibly printing a resist feature over a substrate, wherein the resist feature has a width of as small as 20 nm. The resolution limit of the projection aligner is 20 nm in this particular example.

A conventional ink-jet printer and a conventional continuous printer have resolution limits of approximately 100 μm and approximately 80 μm, respectively, which is about three orders of magnitude greater than the resolution of the projection aligner previously described.

When the apparatus or other equipment is used to print or otherwise form features at sizes less than the resolution limit, undesired effects can occur. For example, corners (from a top view) may become rounded, edges of a feature (from a cross-sectional view) may be curved or sloped rather than substantially vertical, etc. The variation between electronic devices in the amount of corner or edge rounding or other effect may be unacceptable in a manufacturing environment, even though such variation may be tolerated in research and development.

The pitch, which a sum of a feature dimension and a space dimension between immediately adjacent features, may or may not be near the resolution limit of the layer being formed or patterned. The smallest pitch for a layer when used in manufacturing would be the sum of the smallest feature dimension and the smallest space dimension that can be reproducibly formed for the layer. The smallest feature dimension and the smallest space dimension may be the same or different. For example, if the smallest feature dimension is 5 μm and the smallest space dimension is 5 μm, the smallest pitch for the layer is 10 μm. Therefore, in this example, the pitch is near the resolution limit (e.g., pitch is twice the resolution limit).

In other embodiments, the pitch is further from the resolution limit of the layer being printed or patterned. The pitch of one layer may be determined at least in part on the resolution limit of a different layer. For example, Layer 1 can be formed at a resolution limit of 90 μm, Layer 2 can be formed at a resolution limit of 2 μm, and Layer 1 overlies or underlies Layer 2. The pitch of Layer 1 may be no smaller than 180 μm, and the pitch of Layer 2 may be no smaller than 4 μm. If features in Layer 1 and Layer 2 are to be coterminous (from a top view, edges of features in the two layers are line-on-line), Layer 1 and Layer 2 will have the same pitch, and it would not be less than 180 μm. Thus, Layer 1 is printed or patterned at its smallest pitch, but Layer 2 is printed or patterned at a pitch substantially larger than its smallest pitch.

Therefore, the pitch used for a particular layer is not necessarily determined by the resolution limit of the particular layer; however, the smallest pitch that can be used to reproducibly manufacture the particular layer is determined by the resolution limit of that particular layer, given a particular apparatus or other manufacturing equipment. Embodiments described herein take advantage of the difference in resolution limits for different layers formed at different levels to reduce the pixel area and improve resolution of the display.

3. FABRICATION OF AN ELECTRONIC DEVICE

Figure 1:
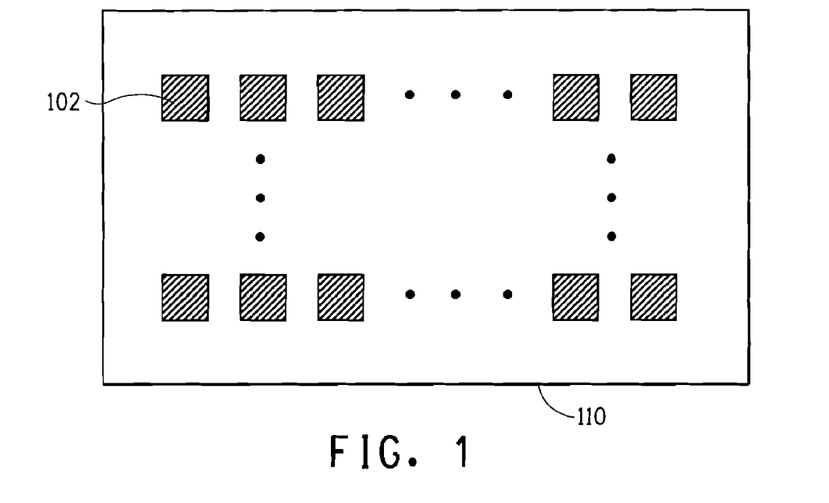
FIG. 1 includes a top view for a portion of an electronic device including a display.

FIG. 1 includes a top view of an electronic device 100 that includes a display 110 having pixels 102. The electronic device 100 can emit radiation, detect radiation, convert radiation to energy, or any combination thereof. In one embodiment, the electronic device 100 emits radiation, and in a more particular embodiment, the electronic device 100 includes radiation-emitting components that are part of an array for a full-color display. In the illustrated embodiment, the pixels 102 are part of a pixel array that is oriented in rows and columns. Other arrangements of the pixels 102 can be used. The electronic device can include peripheral circuitry and remote circuitry (not illustrated) for controlling the plurality of pixels 102. The electronic device 100 can include an active matrix array or a passive matrix array.

Figure 7:
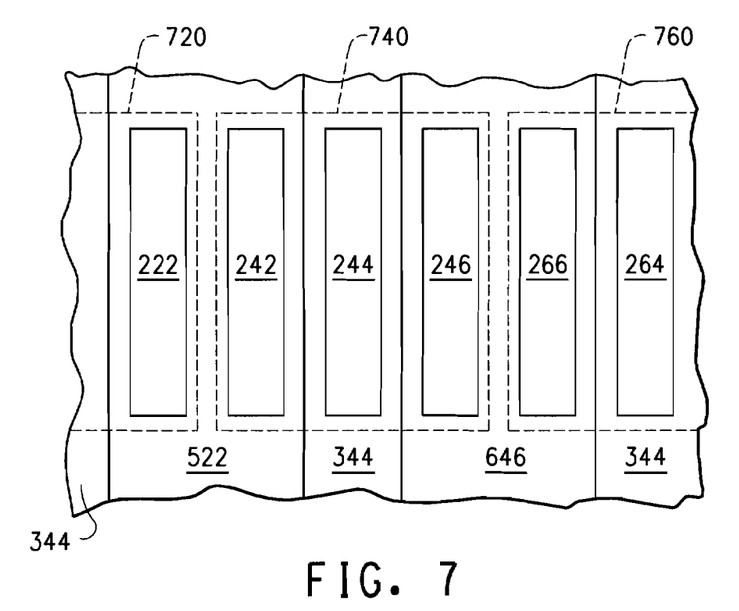
Figure 8:
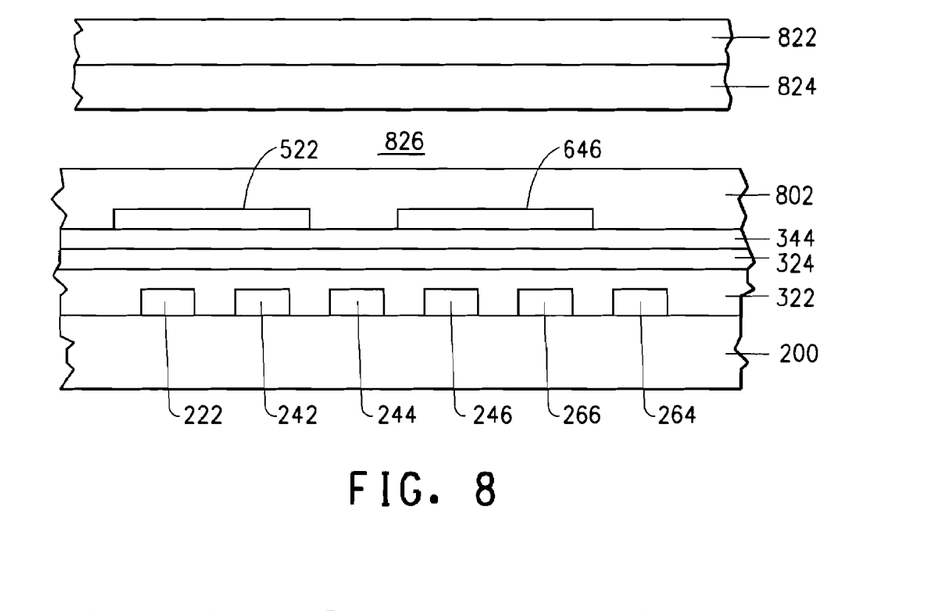
FIG. 8 includes an illustration of a cross-sectional view of the workpiece of FIGS. 6 and 7 after forming a substantially completed electronic device.
Figure 9:
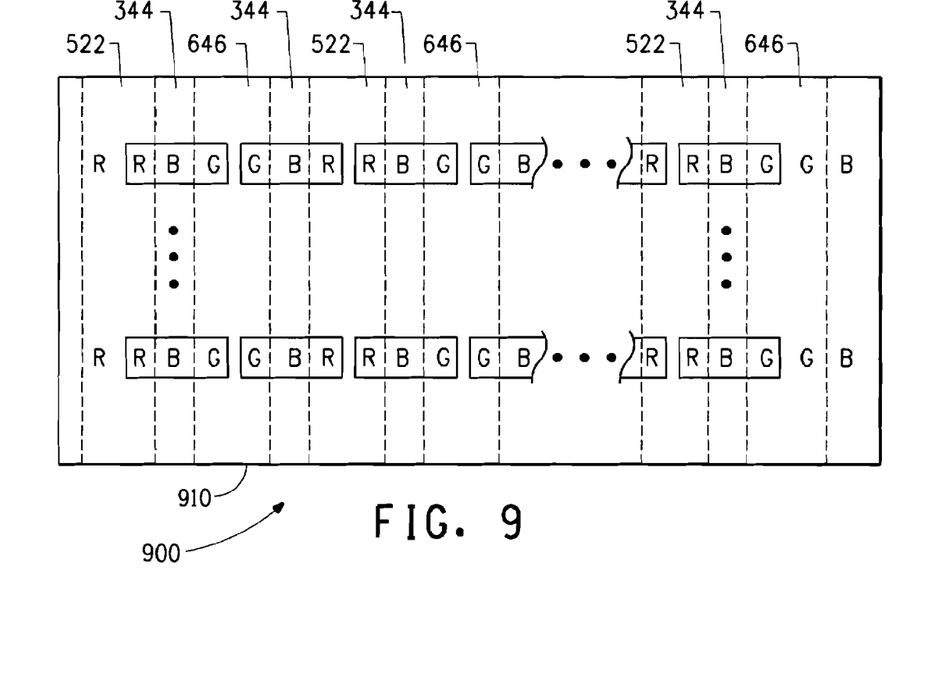
FIG. 9 includes an illustration of a top view of the substrate of FIG. 8 to depict positional relationships between rows and columns of electronic components and the organic active layer and regions.

The fabrication of the electronic device 100 is described in conjunction with FIGS. 2 through 8, and the pixel arrangement is described in conjunction with FIGS. 1 and 9. In the embodiments described with respect to FIGS. 2 through 8, the resolution limit when forming electrodes is approximately 5 μm, and the resolution limit when printing organic active layers is approximately 80 μm. In other embodiments, different apparatuses, equipment, and techniques can give different resolution limits than the values recited above.

Figure 2:
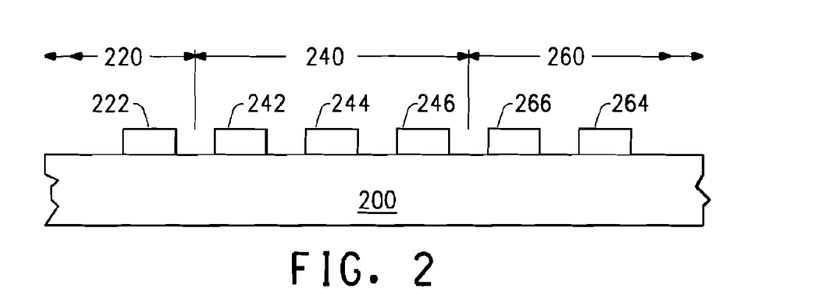
FIG. 2 includes an illustration of a cross-sectional view of a portion of a substrate after forming first electrodes over a portion of the substrate.

Referring to FIG. 2, electrodes 222, 242, 244, 246, 264, and 266 are formed over portions of the substrate 200. The dashed line in FIG. 2 illustrates locations of pixels 220, 240, and 260.

The substrate 200 can be a conventional substrate as used in the electronic device arts. The substrate 200 can be flexible or rigid, organic or inorganic. Generally, glass or flexible organic films are used. A pixel driver or another circuit (not illustrated) may be formed within or over the substrate 200 using conventional techniques. Other circuits that are outside the array may include peripheral or remote circuitry used to control one or more of the pixels within the array. The focus of fabrication is on the pixel array rather than the peripheral or remote circuitry.

In one embodiment, the electrodes 222, 242, 244, 246, 264, and 266 act as anodes and include one or more conductive layers. The pixel 220 includes the electrode 222 and other electrodes (not illustrated in FIG. 2), the pixel 240 includes the electrodes 242, 244, and 246, and the pixel 260 includes the electrodes 264 and 266 and another (not illustrated in FIG. 2). Each of the pixels 220, 240, and 260 can include a different number of electrodes. In a particular embodiment, the electrodes 222 and 242 are part of red light-emitting components, the electrodes 244 and 264 are part of blue light-emitting components, and the first electrode 246 and 266 are part of green light-emitting components. In another embodiment, the colors of the light-emitting components can be changed. For example, the electrodes 244 and 264 can be part of green light-emitting components, and the electrodes 246 and 266 can be part of blue light-emitting components.

The surface of the electrodes 222, 242, 244, 246, 264, and 266 furthest from the substrate 200 includes a high work function material. In this illustrative example, the electrodes 222, 242, 244, 246, 264, and 266 include one or more of layers of indium tin oxide, aluminum tin oxide, or other materials conventionally used for anodes within electronic devices. In this embodiment, the electrodes 222, 242, 244, 246, 264, and 266 transmit at least 70% of the radiation to be emitted from or responded to by subsequently formed organic active layer(s), region(s), or any combination thereof. In one embodiment, the thickness of the electrodes 222, 242, 244, 246, 264, and 266 is in a range of approximately 100 to 200 nm. If radiation does not need to be transmitted through the electrodes 222, 242, 244, 246, 264, and 266, the thickness may be greater, such as up to 1000 nm or even thicker.

The electrodes 222, 242, 244, 246, 264, and 266 can be formed by depositing the conductive layer(s) using a conventional or proprietary technique. The conductive layer(s) can be patterned using a resist mask (not illustrated), which is patterned using a projection aligner. As previously described, the resolution limit of the projection aligner may be approximately 5 μm. However, the design of the electrodes 222, 242, 244, 246, 264, and 266 is determined in part by the resolution limit when forming (e.g., printing) subsequent organic active regions, not by the resolution limit of the projection aligner.

In one embodiment, a pitch for the electrodes 222, 242, 244, 246, 264, and 266 is approximately 40 μm, which is half the resolution limit of the equipment used to print the organic active layer (approximately 80 μm). In another embodiment, a smaller pitch for the electrodes 222, 242, 244, 246, 264, and 266 may be used to allow for misalignment tolerance between the pattern of the electrodes 222, 242, 244, 246, 264, and 266 and the pattern of the subsequently-printed organic active regions.

Regarding the pitch of the electrodes 222, 242, 244, 246, 264, and 266, the widths of the electrodes 222, 242, 244, 246, 264, and 266 may be substantially the same as widths of the corresponding spaces between the electrodes 222, 242, 244, 246, 264, and 266. In another embodiment, the widths of the electrodes 222, 242, 244, 246, 264, and 266 are larger or smaller than the widths of the corresponding spaces. In a particular embodiment, the widths of the electrodes 222, 242, 244, 246, 264, and 266 are approximately 30 μm each and the widths of the corresponding spaces are approximately 10 μm each. These widths are larger than the resolution limit of the projection aligner (approximately 5 μm) and smaller than the resolution limit of the printer (approximately 80 μm) for the organic active regions.

The resist mask (not illustrated) covers portions of the conductive layer(s) that will remain. A conventional or proprietary etch is performed to remove exposed portions of the conductive layers(s) to form the electrodes 222, 242, 244, 246, 264, and 266. The resist mask is removed using a conventional ashing technique.

In an alternative embodiment, the electrodes 222, 242, 244, 246, 264, and 266 can be formed using a conventional or proprietary physical vapor deposition apparatus (e.g., an evaporator or a sputtering tool) with a stencil mask. If the resolution limit of the physical vapor deposition-stencil mask technique is no greater than approximately 10 μm, the embodiment with the approximately 30 μm features and approximately 10 μm spaces can be used.

Although not illustrated, material containment structures can be formed to help contain subsequently printed organic active regions. The material containment structures can include well structures, cathode separators or the like. In one embodiment, the material containment structures would lie to the left of the first electrode 222, between the electrodes 242 and 244, between the electrodes 244 and 246 and, between the electrodes 266 and 264.

Figure 3:
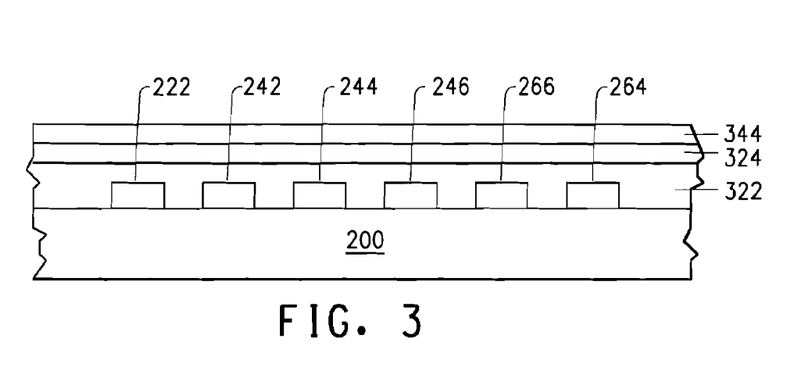
FIG. 3 includes an illustration of a cross-sectional view of the substrate of FIG. 2 after forming an organic layer.

An organic layer is formed over the electrodes 222, 242, 244, 246, 264, and 266 as illustrated in FIG. 3. The organic layer may include one or more layers. For example, the organic layer can include an organic active layer and any one or more of a buffer layer or a charge-injecting layer, a charge-transport layer, or a charge-blocking layer. A charge-blocking layer may be an electron-blocking layer or a hole-blocking layer, a charge-injecting layer may be an electron-injecting layer or a hole-injecting layer, and a charge-transport layer may be an electron-transport layer or a hole-transport layer. Many different embodiments for the organic layer can be used. Some are described with respect to FIGS. 3 to 6, and others are described with respect to other embodiments illustrated in FIGS. 10 to 14.

In one embodiment, the organic layer includes a charge-injection layer 322, a charge-transport layer 324, and an organic active layer 344. When the charge-injection layer 322 is a doped buffer layer, and the charge-transport layer 324 is a hole-transport layer, one or more of materials can be used, and selection of material(s) can depend on the device and the material within the organic active layer 344. In this illustrative example, each of the a charge-injection layer 322 can include polyaniline ("PANI"), poly(3,4-ethylenedioxythiophene) ("PEDOT"), polypyrrole, material(s) conventionally used as a hole-injection or hole-transport layer as used in an electronic device, or any combination thereof.

The charge-transport layer 324 can include a polymer. When the charge-transport layer 324 includes a hole-transport material, the charge-transport layer 324 includes a hole-transport group. Such hole-transport groups include carbazole, triarylamines, triarylmethane, fluorene, and combinations thereof. Commonly used hole-transporting polymers include polyvinylcarbazole, (phenylmethyl)polysilane, poly(dioxythiophenes), polyanilines, and polypyrroles. In addition, a hole-transporting polymer can be made by doping hole-transporting molecules, such as those mentioned above, into a polymer such as polystyrene, polycarbonate, or a combination thereof. In a particular embodiment, the charge-transport layer 324 can include any of the abovementioned materials and a fullerene. The fullerene can be bucky balls, bucky tubes, or any combination thereof.

In one embodiment, the charge-injection layer 322 has a different composition as compared to the charge-transfer layer 324. Each of the charge-injection layer 322 and the charge-transfer layer 324 has a thickness in a range of approximately 10 to 250 nm.

The composition of the organic active layer 344 can depend upon the application of the electronic device. In the embodiment illustrated in FIG. 3, the organic active layer 344 is used in radiation-emitting components. The organic active layer 344 can include material(s) as conventionally used as an organic active layer in an electronic device and can include one or more small molecule materials, one or more polymer materials, or any combination thereof. After reading this specification, skilled artisans will be capable of selecting appropriate material(s), layer(s) or both for the organic active layer 344.

In one embodiment, the organic active layer 344 can include a blue light-emitting layer, a green light-emitting layer, or a red-light emitting layer. In another embodiment, the organic active layer 344 can emit radiation having an emission maximum at a wavelength within the visible light spectrum or outside the visible light spectrum (e.g., infrared, ultraviolet, etc.). In one embodiment, the organic active layer 344 is no greater than approximately 90 nm. In another embodiment, the organic active layer 344 has a thickness in a range of approximately 20 to 70 nm.

Each of the charge injection layer 322, charge-transport layer 324, and the organic active layer 344 can be formed by one or more of any number of different techniques including spin coating, casting, vapor depositing (chemical or vapor), printing (ink-jet printing, screen printing, solution dispensing (dispensing the liquid composition in strips or other predetermined geometric shapes or patterns, as seen from a top view), or any combination thereof), other depositing technique or any combination thereof for appropriate materials as described below. In a particular embodiment, each of the charge-injection layer 322 and the charge-transport layer 324 are deposited as liquids, and in another particular embodiment, the organic active layer 344 is vapor deposited. The charge-injection layer 322, the charge-transport layer 324, the organic active layer 344, or any combination thereof may be cured after deposition.

As formed, the organic layer (including the charge-injection layer 322, the charge-transport layer 324, and the organic active layer 344) is substantially continuous over an array of electronic components being formed. In one embodiment, the organic layer may be substantially continuous over the array or the entire substrate, including the peripheral circuitry area, remote circuitry area or both areas.

In an alternative embodiment, the organic layer may include a single layer with a composition that varies with thickness. For example, the composition nearest the electrodes 222, 242, 244, 246, 264, and 266 may act as a hole transporter, the next composition may act as an organic active layer, and the composition furthest from the electrodes 222, 242, 244, 246, and 266 may act as an electron transporter. Similarly, the function of charge-injecting, charge-transport, charge-blocking, or any combination thereof can be incorporated into the organic layer. One or more materials may be present throughout all or only part of the thickness of the organic layer.

Figure 4:
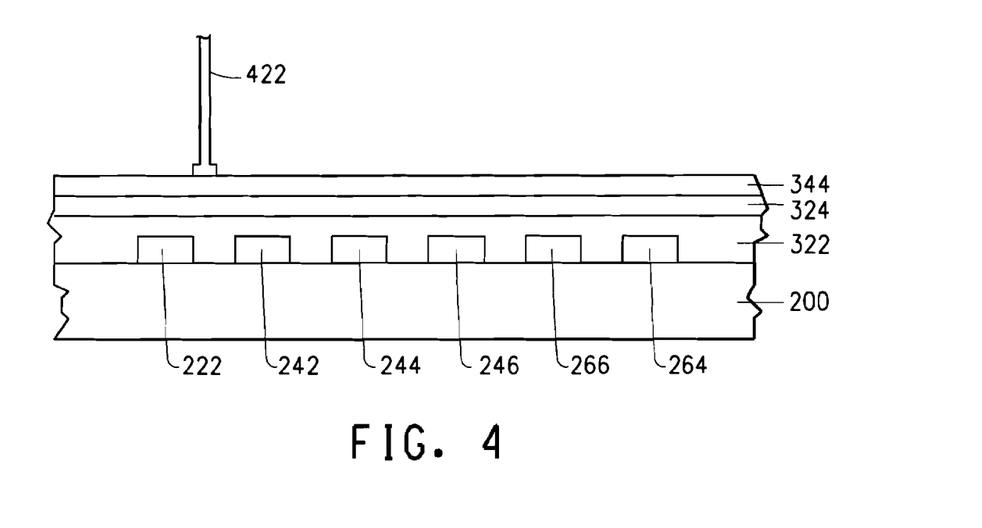
FIG. 4 includes an illustration of a cross-sectional view of the substrate of FIG. 5 when dispensing a liquid composition.
Figure 5:
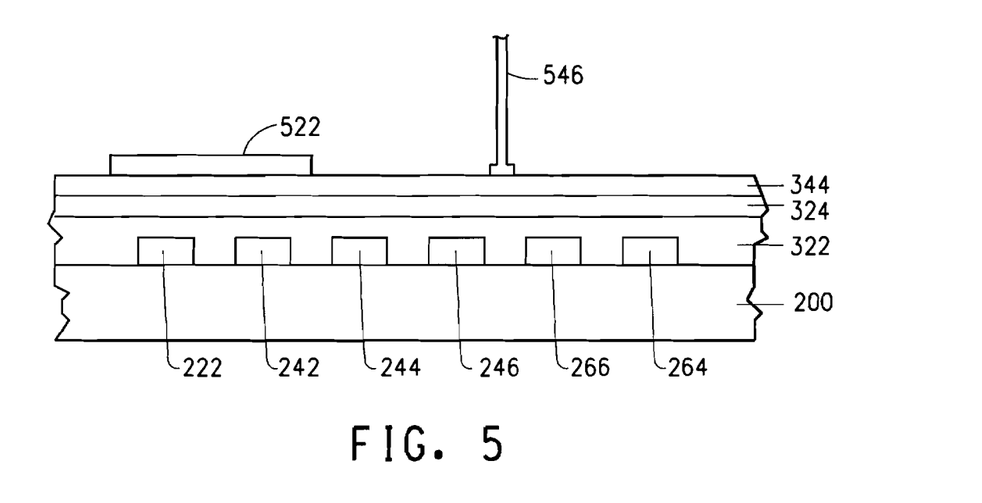
FIG. 5 includes an illustration of a cross-sectional view of the substrate of FIG. 6 when dispensing another liquid composition.

One or more liquid compositions may be placed over portions of the organic layer as illustrated in FIGS. 4 and 5. In one embodiment, the organic active layer 344 includes a material that can emit blue light, a liquid composition 422 (FIG. 4) may include a red light-emitting material, and a liquid composition 546 (FIG. 5) may include a green light-emitting material.

The liquid compositions 422 and 546 can be placed over the organic layer using a precision deposition technique. A stencil mask, frame, well structure, patterned layer or other structure(s) may or may not be present during such deposition. Non-limiting examples of the precision deposition technique include screen printing, ink-jet printing, solution dispense, needle aspiration, selective plating, and combinations thereof. The liquid compositions 422 and 546 may be placed over the organic layer sequentially or substantially simultaneously. In the illustrated embodiment, the liquid composition 422 is placed over the organic layer before the liquid composition 546 is placed over a different part of the organic layer. In one particular embodiment, the precision printing technique can include ink-jet printing or continuous printing.

Figure 6:
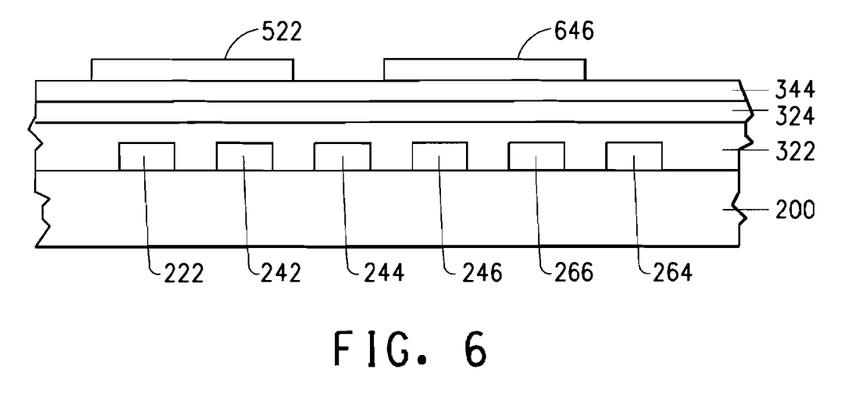
FIGS. 6 and 7 include illustrations of a cross-sectional view and top view, respectively, of the workpiece of FIG. 5 after forming organic active regions over an organic active layer.

After placing the liquid compositions 422 and 546 over the organic layer, the liquid medium of the liquid compositions 422 and 546 is then evaporated to form the organic active regions 522 and 646, as illustrated in FIGS. 5 and 6. After evaporation, the organic layer, including the organic active layer 344 and the organic active regions 522 and 646, is substantially solid. In the embodiment as illustrated, the organic active layer 344 is configured to emit blue light, the organic active region 522 is configured to emit red light, the organic active region 646 is configured to emit green light.

In one embodiment, the organic active regions 522 and 646 have thicknesses within 10 nm of each other. In one specific embodiment, each of the organic active regions 522 and 646 has a thickness of at least approximately 50 nm. In another embodiment, each of the organic active regions 522 and 646 has a thickness in a range of approximately 60 to 100 nm, and in a more specific embodiment, in a range of approximately 70 to 90 nm. In one embodiment, organic active regions 522 and 646 are at least approximately 20 nm thicker that the organic active layer 344 as originally formed at the same locations as the organic active regions 522 and 646. In another embodiment, the thickness of any one or more organic active regions may be less than 50 nm or more than approximately 100 nm.

In the embodiment as illustrated in FIG. 6, the organic active region 522 overlies the electrodes 222 and 242 and the space between the electrodes 222 and 242, and the organic active region 646 overlies the electrodes 246 and 266 and the space between the electrodes 246 and 266. Portions of the organic active layer 344, which are not covered by the organic active region 522 or 646, overlie the electrodes 244 and 264.

In other embodiments, other configurations of can be used. A different organic active layer (not illustrated) can used in place of or in conjunction with the organic active layer 344, the organic active region 522 or 646, or any combination thereof. For example, the other organic active layer may emit radiation within the visible light spectrum (e.g., blue light or green light) or outside the visible light spectrum (e.g., ultraviolet or shorter wavelengths). The other organic active layer can be liquid or vapor deposited.

The resolution limits of such printing techniques are no less than approximately 80 μm. Therefore, the widths of the organic active regions 522 and 646 are no less than approximately 80 μm. In one embodiment, the pitch of the underlying electrodes is approximately half of the resolution limit of the equipment and process used in forming the organic active regions 522 and 646. In a particular embodiment, the resolution limit is approximately 80 μm, the pitch for the electrodes is 40 μm, the electrodes are approximately 30 μm wide, and the space between the electrodes is approximately 10 μm. Thus, the resolution limit corresponding to the organic active regions 522 and 646 (approximately 80 μm) is more than twice the width of the electrodes (approximately 60 μm or 2×30 μm) and is more than a sum of the pitch (approximately 40 μm) and a width of a first electrode (approximately 30 μm). Note that each of the pitch and widths of the electrodes and spaces between the electrodes are greater than the resolution limit for the equipment and process used to form the electrodes. After reading this specification, skilled artisans will appreciate that the specific values disclosed are used to illustrate the concepts as described herein. Other values may be used as needed or desired without departing from the scope of the present invention.

FIG. 7 includes pixels that have red, green, and blue light-emitting components. Red light-emitting components include the organic active region 522 and the electrodes 222 and 242, green light-emitting components include the organic active region 646 and the electrodes 246 and 266, and blue light-emitting components include the remaining portions of the organic active layer 344 (i.e., portions not covered by the organic active region 522 or the organic active region 646) and the electrodes 244 and 264.

FIG. 7 includes a top view of a portion of the electronic device that includes pixels, arranged in rows and columns. In FIG. 7, the pixels 720, 740, and 760, are illustrated with dashed lines. Only portions of the pixels 720 and 760 and substantially all of the pixel 740 are illustrated. The organic active regions 522 and 646 are in the form of a spaced-apart strips extending from the top to the bottom of FIG. 7. Each of the organic active regions 522 and 646 overlies a two-column set of the electrodes, and each of the remaining portions of the organic active layer 344 overlies a single column of the electrodes.

In one embodiment, each pixel includes three radiation-emitting components, wherein the radiation-emitting regions correspond to the shapes of the electrodes. In a particular embodiment, red light will be emitted by radiation-emitting components that correspond to the electrodes 222 and 242, green light will be emitted by radiation-emitting components that correspond to the electrodes 246 and 266, and blue light will be emitted by radiation-emitting components that correspond to the electrodes 244 and 264. Therefore, the electronic device has a repeating emission pattern of RRBGGB, wherein R corresponds to a red radiation-emitting component, B corresponds to a blue radiation-emitting component, and G corresponds to a green radiation-emitting component, which is different from a conventional RGB or RBG repeating emission pattern. Each red light-emitting component lies between a blue light-emitting component within the same pixel and another red light-emitting component within a different pixel. Each green light-emitting component lies between a blue light-emitting component within the same pixel and another green light-emitting component within another different pixel. Each blue light-emitting component lies between a red light-emitting component and a green light-emitting component, all within the same pixel.

In other embodiments, more, fewer or different components can be used. For example, another liquid composition can be used to form radiation-responsive components, such as sensors. This other liquid composition can be used in conjunction with or in place of any of the other liquid compositions. The layout may be changed as needed or desired to achieve the designed performance of the electronic device. With the layout as illustrated in FIG. 7, the electronic device can be formed to have double the density of electronic components when the organic active regions 522 and 646 are formed at the resolution limit of current printing techniques for liquid compositions.

Fabrication is continued to form a substantially completed electronic device, as illustrated in FIG. 8. Although not illustrated, optional charge-injecting, charge-transport, or charge-blocking layer(s) may be formed over the organic active layer 344 and organic active regions 522 and 646. A common electrode 802 is formed over the organic active layer 344 and organic active regions 522 and 646. In this specific embodiment, the common electrode 802 acts as a common cathode for the array. The formation (e.g., deposition, etching, etc.), materials, and thicknesses for the optional charge-injecting layer, charge-transport layer, charge-blocking layer, or any combination thereof, and the second electrode 802 are conventional or proprietary.

Other circuitry not illustrated in FIG. 8 may be formed using one or more of the previously described or additional layers. Although not illustrated, additional insulating layer(s) and interconnect level(s) may be formed to allow for circuitry in peripheral areas (not illustrated) that may lie outside the array. Such circuitry may include a row or column decoder, a strobe (e.g., row array strobe, column array strobe), a sense amplifier, or any combination thereof. Alternatively, such circuitry may be formed before, during, or after the formation of any of the layers illustrated in FIG. 8.

A lid 822 with a desiccant 824 is attached to the substrate 200 at locations (not illustrated) outside the array to form a substantially completed device. A gap 826 lies between the second electrode 802 and the desiccant 824. The materials used for the lid 822 and desiccant 824 and the attaching process are conventional.

FIG. 9 includes a top view of the substantially completed electronic device 900 that includes a matrix 910 of radiation-emitting components, radiation-responsive components, or a combination thereof. The second electrode 802, the lid 822, and the desiccant 824 are not illustrated in FIG. 9 to better illustrate positional relationships between components and between different rows. The organic active regions 522 and 646 are in the form of strips that are spaced apart from one another. Remaining portions of organic active layer 344 lie between the organic active regions 522 and 646, which are illustrated by dashed-line areas in FIG. 9. Each pixel is illustrated by a box including red, blue, and green light-emitting components. In a particular embodiment, a full-color display is formed in which two separate spaced columns of blue light-emitting components lie along opposites sides of each two-column set of red light-emitting components and two-column set of green light-emitting components.

4. ALTERNATIVE EMBODIMENTS

Figure 10:
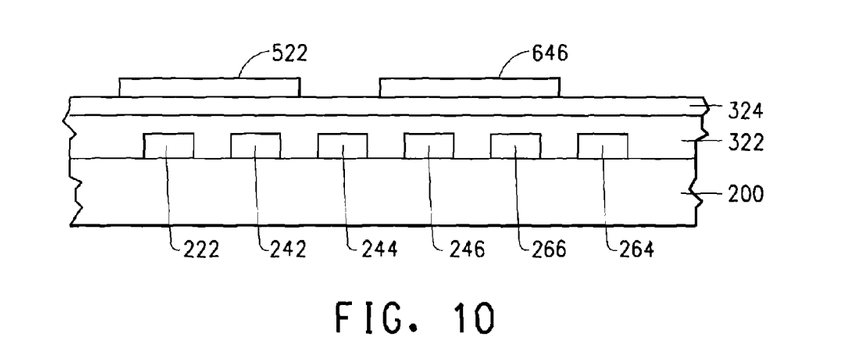
FIGS. 10 to 13 include illustrations of cross-sectional views after forming organic active layers and regions in accordance with alternative embodiments.
Figure 11:
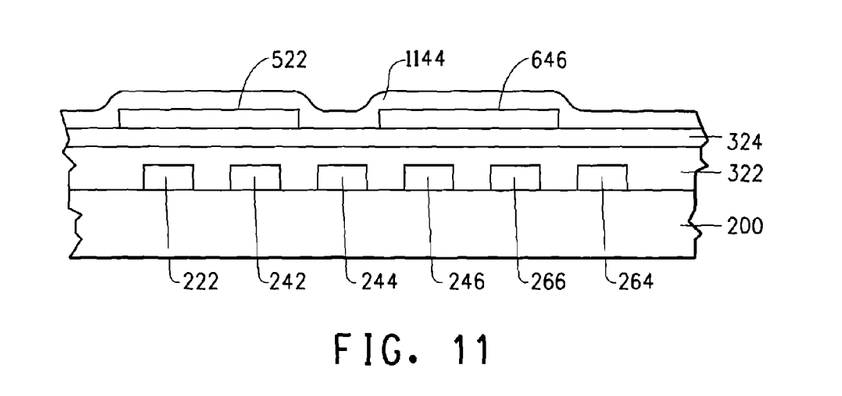

Many different embodiments are possible regarding the formation of the organic layer. In one embodiment, the organic active region 522, 646, or both could be formed before, rather than after, forming an organic active layer, such as the organic active layer 344. In FIG. 10, the organic active regions 522 and 646 can be formed on the charge-transport layer 324. An organic active layer 1144 can be formed over charge-transport layer 324 and the organic active regions 522 and 646, as illustrated in FIG. 11. The organic active layer 1144 can include any of the materials and thicknesses and be formed by any of the deposition techniques described with respect to the organic active layer 344. Similar to the organic active layer 344, the organic active layer 1144 can be continuous over an array of electronic components being formed. In a particular embodiment, the charge-transport layer 324 includes a fullerene, and the organic active layer 1144 is vapor deposited.

Figure 12:
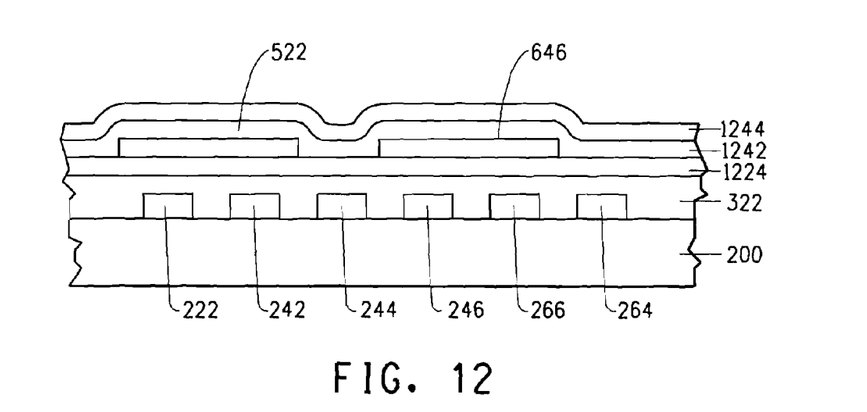

In still another embodiment, another layer can be formed after forming the organic active regions 522 and 646 and before forming an organic active layer. This embodiment can be useful if a subsequently formed organic active layer is incompatible with an underlying layer, due to electronic, mechanical, or chemical properties. In FIG. 12, after forming the charge-injection layer 322, a charge-transport layer 1224 is formed. The charge-transport layer 1224 can include any of the materials and thicknesses and be formed by any of the deposition techniques described with respect to the charge-transport layer 324. The organic active regions 522 and 646 can be formed as previously described.

Another charge-transport layer 1242 can be formed after forming the organic active regions 522 and 646. The charge-transport layer 1242 can include any of the materials and thicknesses and be formed by any of the deposition techniques described with respect to the charge-transport layer 324. In one embodiment, the charge-transport layer 1242 has a different composition as compared to the charge-transport layer 1224. For example, the charge-transport layer 1224 can include a hole-transporting material with substantially no fullerene, and the charge-transport layer 1242 can include a hole-transporting material and a fullerene. The charge-transport layer 1242 is sufficiently thick to allow a subsequently-formed organic active layer to be vapor deposited and still achieve acceptable electronic performance. The charge-transport layer 1242 is sufficiently thin to allow components that including the organic active region 522 or 646 to operate properly. In a particular embodiment, the charge-transport layer 1242 has a thickness in a range of 0.1 to 10 nm.

An organic active layer 1244 can then be formed over the charge-transport layer 1242. The organic active layer 1244 can include any of the materials and thicknesses and be formed by any of the deposition techniques described with respect to the organic active layer 344. In a particular embodiment, the organic active layer 1244 includes a blue light-emitting material, and in another particular embodiment, the organic active layer 1244 is vapor deposited.

In still another embodiment (not illustrated), organic active layers may underlie and overlie the organic active region 522, organic active region 646, or both. Referring to FIG. 6, after forming the organic active regions 522 and 646, an organic active layer (similar to organic active layer 1244) can be formed over the organic active regions 522 and 646 before another electrode (e.g., a common cathode) is formed. The combined thickness of the organic active layer 344 and the other organic active layer (over the organic active regions 522 and 646) can be in a range of approximately 50 nm to 100 nm. The organic active layer 344 and the other organic active layer can have the same composition or different compositions, the same thickness or different thicknesses, and can be formed by the same deposition technique or different deposition techniques (e.g. liquid depositing for one of the organic active layers and vapor depositing the other).

Figure 13:
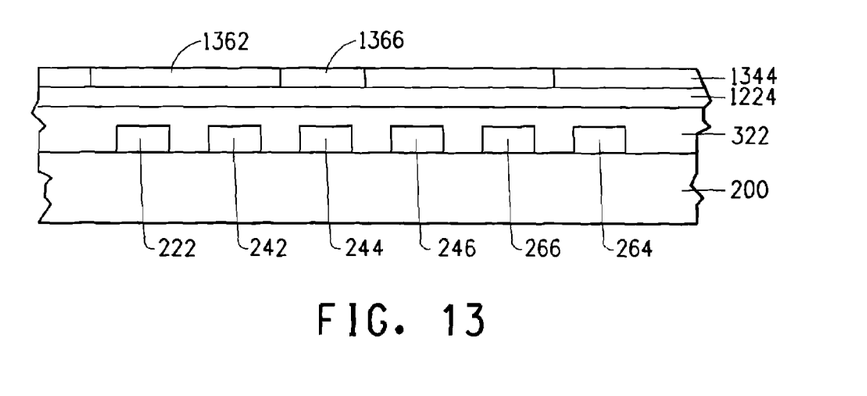

In yet another embodiment, host and guest materials can be used in forming the organic active layer and regions, as illustrated in FIG. 13. In one embodiment, after forming the charge-injection layer 322 and the charge-transport layer 1242 (described with respect to FIG. 12), an organic active layer 1344 is formed over the charge-transport layer 1242. The organic active layer 1344 can include any of the materials and thicknesses and be formed by any of the deposition techniques described with respect to the organic active layer 344. In the embodiment as illustrated in FIG. 13, the organic active layer 1344 includes a host material.

Different liquid compositions, which include different guest materials, can be used to form organic active regions 1362 and 1364. Before the placement of the liquid compositions, the organic active layer 1344 may or may not be substantially solid. The liquid compositions can be placed over the organic active layer 1344 using any of the materials and deposition techniques as described with respect to liquid compositions 422 (FIG. 4) and 546 (FIG. 5). A stencil mask, frame, well structure, patterned layer or other structure(s) may or may not be present during such deposition. The liquid compositions may be placed over the organic active layer 1344 sequentially or substantially simultaneously.

In one embodiment, the liquid compositions can be deposited using a precision printing technique. Non-limiting examples of the precision deposition technique include screen printing, ink-jet printing, solution dispense, needle aspiration, selective plating, or any combination thereof. After placing the liquid compositions over the organic active layer 1344, substantial amounts of the guest material(s) within the liquid compositions intermix with the organic layer. The liquid medium of the liquid compositions is then evaporated to form the organic active regions 1362 and 1366, as illustrated in FIG. 13. After evaporation, the organic active layer 1344, including the organic active regions 1362 and 1366 and the remaining portions of the organic active layer 1344 are substantially solid. In a particular embodiment, the organic active layer 1344 can include blue light-emitting material, the organic active region 1362 can include a red guest material, and the organic active region 1366 can include a green guest material. Similar to prior embodiment, the organic active regions can be formed using a precision deposition technique.

In one embodiment, the organic active regions 1362 and 1366 have thicknesses within approximately 10 nm of each other. In one specific embodiment, each of the organic active regions 1362 and 1366 has a thickness of at least approximately 50 nm. In another embodiment, each of the organic active regions 1362 and 1366 has a thickness in a range of approximately 60 to 100 nm, and in a more specific embodiment, in a range of approximately 70 to 90 nm. In one embodiment, organic active regions 522 and 646 are at least approximately 20 nm thicker that the organic active layer 1344 as originally formed at the same locations as the organic active regions 1362 and 1366. In another embodiment, the thickness of any one or more organic active regions may be less than approximately 50 nm or more than approximately 100 nm.

After reading this specification, skilled artisans will appreciate that other embodiments can be used when forming the various layers and regions within the organic layer. Different materials and different orders of formation can be used. While many embodiments include depositing an organic active layer over the array having a blue light-emitting material, skilled artisans clearly understand that the organic active layer may include a different emitting material, such a green light-emitting material, a red light-emitting material, an ultraviolet or infrared radiation-emitting material, or any combination thereof. In another embodiment (not illustrated), the organic active layer 1344 and organic active regions 1362 and 1366 (FIG. 13) can include another organic active layer that underlies or overlies them. In yet another embodiment, the host material is not part of an organic active layer. For example, a charge-injection, a charge-transport, or a charge-blocking layer can include a host material over which liquid compositions can be dispensed. A separate organic active layer can be formed before or after the layer that includes the host material. After forming the organic layer using any of the embodiments, the process can further include electrode formation and encapsulation as described with respect to FIG. 8.

The concepts as described herein can be extended to a variety of different electronic devices. Different organic active materials can be used. For example, a sensor array, rather than a display, can be formed. Different organic active materials may be useful in sensing radiation at different wavelengths. Also, the electronic device may operate or sense radiation outside the visible light spectrum. For example, the electronic device can be designed to emit or sense ultraviolet or infrared radiation.

The orientation of rows and columns can be reversed. Instead of single columns of blue light-emitting components separating two-column sets of red and green light-emitting components, single rows of blue light-emitting components separating two-row sets of red and green light emitting components.

Figure 14:
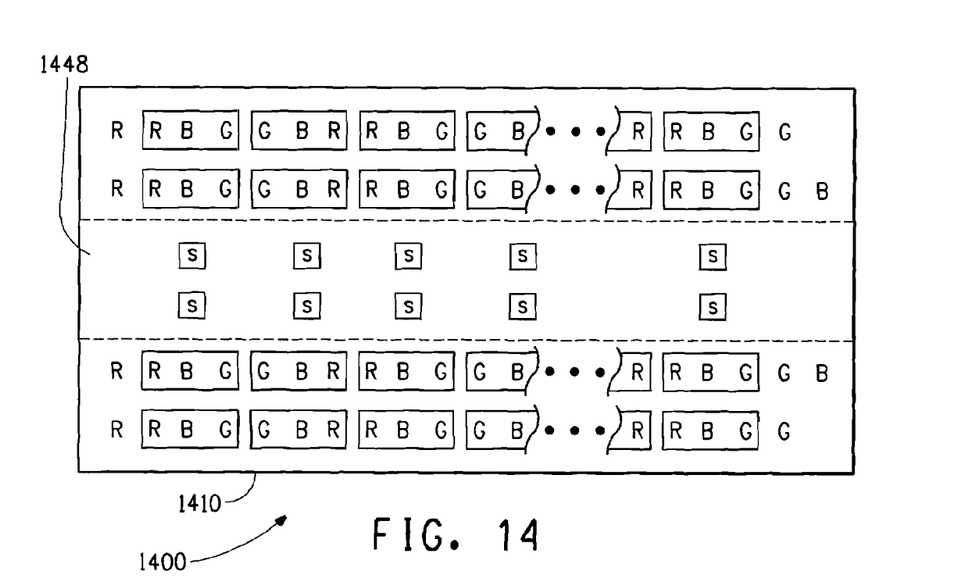
FIG. 14 includes an illustration of a top view of an electronic device in accordance with an alternative embodiment.

In addition, both columns and rows can be used. For example, two rows of radiation-responsive components may be located between two sets of rows of radiation-emitting components. FIG. 14 includes an illustration of a top view of an electronic device similar to the electronic device 900 in FIG. 9, except that two rows of sensors ("S") are located between two-row sets of radiation emitters. In one embodiment, a liquid composition is printed at or near the resolution limit to form organic active region 1448. The length of the organic active region 1448 is substantially perpendicular to the lengths of the organic active regions 522 and 646 (not illustrated in FIG. 14).

The concepts described herein can be scaled with the resolution limits. Also, the concepts can be used in forming filters. In yet another embodiment, the concepts can be used extended to top-emitting electronic devices, in addition to bottom-emitting electronic devices.

5. OPERATING THE ELECTRONIC DEVICE

The operation of the electronic device is described with respect to the embodiment illustrated in FIG. 8. During operation of a display, appropriate potentials are placed on the electrodes 222, 242, 244, 246, 264, or 266 and the second electrode 802 to cause radiation to be emitted from the radiation-emitting components. More specifically, when light is to be emitted, a potential difference between the first and second electrodes allows electron-hole pairs to combine within the organic layer, the organic active region 522 or 646, or a combination thereof, so that light or other radiation may be emitted from the electronic device. In a display, rows and columns can be given signals to activate the appropriate pixels to render a display to a viewer in a human-understandable form.

During operation of a radiation detector, such as a photodetector, sense amplifiers may be coupled to the first electrode 222, 242, 244, 246, 264, 266, or the second electrode 802 of the array to detect significant current flow when radiation is received by the electronic device. In a voltaic cell, such as a photovoltaic cell, light or other radiation can be converted to energy that can flow without an external energy source. After reading this specification, skilled artisans are capable of designing the electronic devices, peripheral circuitry, and potentially remote circuitry to best suit their particular needs.

6. BENEFITS

The concepts as described herein can be used to form electronic components that are significantly smaller than the largest resolution limit of the equipment and processes used in forming the electronic components. The layout of the display is designed to take advantage of the difference between the resolution limits of two different layers formed by different apparatuses or equipment. Two rows or columns of substantially identical electronic components (e.g., radiation-emitting components or radiation-responsive components) can be fabricated using a feature printed or patterned at or near its resolution limit and achieve components that have feature sizes that are less than half of the resolution limit. Higher densities of components can be formed allowing resolutions of displays, sensor array, or other matrices of electronic component to be increased.

Many different materials, deposition techniques, and orders of formation for the organic layer can be used. The organic layer can include a small molecule material, a large molecule material, or any combination thereof. The organic layer can be deposited using a liquid deposition technique, a vapor deposition technique, or any combination thereof. Precision deposition techniques can include an ink-jet printer, a continuous printer, or other suitable printer. An organic active layer can be formed before an organic active region, or vice versa. A hole-transport layer may be formed before or after some of the organic active layers or regions. Thus, the embodiments allow for great flexibility to allow use in a wide variety of applications and manufacturing environments.

The concepts leverage existing technology, and therefore, do not require new process technology or more advanced equipment in order to form the electronic devices with higher component densities.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A process of forming an electronic device comprising:
   providing a substrate;
   forming a first set and a second set of first electrodes over the substrate, wherein:
     each of the first and second sets of the first electrodes is oriented substantially along a direction; and
     the first set of the first electrodes is spaced apart from the second set of the first electrodes by a first space;
   forming a third set and a fourth set of second electrodes over the substrate, wherein:
     each of the third and fourth sets of the second electrodes is oriented substantially along the direction; and
     the third set of the second electrodes is spaced apart from the fourth set of the second electrodes by a second space;
   forming a fifth set of third electrodes over the substrate and between the first set of the first electrodes and the third set of the second electrodes;
   forming a first organic active region over the substrate, wherein the first organic active region overlies or underlies the first and second sets of the first electrodes and the first space;
   forming a second organic active region over the substrate, wherein the second organic active region overlies or underlies the third and fourth sets of the second electrodes and the second space; and
   forming a third organic active layer over the substrate, wherein the third organic active layer lies between the first organic active region and the second organic active region and overlies or underlies the fifth set of third electrodes.

2. The process of claim 1, wherein forming the first and second sets of the first electrodes, forming the third and fourth sets of the second electrodes, and forming the fifth set of the third electrodes are performed substantially simultaneously.

3. The process of claim 2, wherein forming the third organic active layer is performed before forming the first organic active region and forming the second organic active region.

4. The process of claim 1, wherein forming the first organic active region is performed using equipment, wherein a width of the first organic active region is no more than 1.5 times a resolution limit of the equipment.

5. The process of claim 1, wherein forming the first organic active region is performed such that a width of the first organic active region is no greater than 150 microns.

6. The process of claim 1, wherein each of forming the first organic active region and forming the second organic active region is performed using a liquid deposition technique.

7. The process of claim 6, further comprising forming a material containment structure before forming the first organic active region and forming the second organic active region.

8. The process of claim 6, wherein forming the third organic active layer comprises forming the third organic active layer using a vapor deposition technique after forming the first organic active region and forming the second organic active region.

9. The process of claim 1, wherein:
forming the first organic active region comprises forming the first organic active region as a first continuous strip over the first electrodes and the first space; and
forming the second organic active region comprises forming the second organic active region as a second continuous strip over the second electrodes and the second space.

10. The process of claim 9, wherein forming the third organic active layer comprises forming the third organic active layer over substantially all of a pixel array.

11. The process of claim 1, further comprising forming a common electrode over the substrate, wherein the electronic device comprises a pixel array including the common electrode, the first electrodes, the first organic active region, the second electrodes, the second organic active region, the third electrodes, and the third organic active layer.

12. An electronic device comprising:
a first electrode of a first sub-pixel of a first pixel, wherein the first electrode has a corresponding pitch;
a first organic active region, wherein the first organic active region has a width greater than the corresponding pitch;
a first electrode of a first sub-pixel of a second pixel, wherein:
from a top view, a first space lies between the first electrodes and the first organic active region lies adjacent to the first electrodes and the first space;
a second electrode of a second sub-pixel of the first pixel;
a second electrode of a second sub-pixel of a third pixel, wherein from a top view, a second space lies between the second electrodes;
a second organic active region lying adjacent to the second electrodes and the second space;
a third electrode of a third sub-pixel of the first pixel, wherein the third electrode lies between the first electrode of the first sub-pixel of the first pixel and the second electrode of the second sub-pixel of the first pixel;
a third electrode of a third sub-pixel of the second pixel, wherein the third sub-pixel of the second pixel lies adjacent to the first sub-pixel of the second pixel;
a third electrode of a third sub-pixel of the third pixel, wherein the third sub-pixel of the third pixel lies adjacent to the second sub-pixel of the third pixel; and
a third organic active layer lying adjacent to the third electrodes;
wherein,
the first organic active region overlies the first electrodes but not the second electrodes or the third electrodes;
the second organic active region overlies the second electrodes but not the first electrodes or the third electrodes; and
a third organic active layer overlies the third electrodes.

13. The electronic device of claim 12, wherein:
each of the first sub-pixels includes a red light-emitting component;
each of the second sub-pixels includes a green light-emitting component; and
each of the third sub-pixels includes a blue light-emitting component.

14. The electronic device of claim 13, wherein along an axis, the electronic device has a repeating emission pattern of RRBGGB, wherein:
R corresponds to a red light-emitting component;
B corresponds to a blue light-emitting component; and
G corresponds to a green light-emitting component.

15. An electronic device comprising:
a first set of first electrodes oriented substantially along a direction;
a second set of first electrodes oriented substantially along the direction;
a first space between the first and second sets of the first electrodes; and
a first organic active region, wherein the first organic active region overlies or underlies the first and second sets of first electrodes and the first space,
wherein the first organic active region is characterized by a corresponding resolution limit, and a width of the first organic active region is less than 2 times the corresponding resolution limit.

16. The electronic device of claim 15, further comprising:
a third set of second electrodes oriented substantially along the direction;
a fourth set of second electrodes oriented substantially along the direction;
a second space between the third and fourth sets of the second electrodes; and
a second organic active region, wherein the second organic active region overlies or underlies the second electrodes and the second space.

17. The electronic device of claim 16, wherein the first electrodes, the first space, and the first organic active region are spaced apart from the second electrodes, the second space, and the second organic active region.

18. The electronic device of claim 17, further comprising a material containment structure, wherein substantially none of the material containment structure overlies the first space or the second space.

19. The electronic device of claim 18, further comprising:
a fifth set of third electrodes oriented substantially along the direction and lying between the first set of first electrodes and the third set of second electrodes; and
a third organic active layer lying above or below the third electrodes.

* * * * *